United States Patent [19]

Higgins, III

[11] Patent Number: 5,434,452
[45] Date of Patent: Jul. 18, 1995

[54] Z-AXIS COMPLIANT MECHANICAL IC WIRING SUBSTRATE AND METHOD FOR MAKING THE SAME

[75] Inventor: Leo M. Higgins, III, Austin, Tex.

[73] Assignee: Motorola, Inc., Schaumburg, Ill.

[21] Appl. No.: 309,570

[22] Filed: Sep. 20, 1994

Related U.S. Application Data

[63] Continuation of Ser. No. 143,775, Nov. 1, 1993, abandoned.

[51] Int. Cl.⁶ ................. H01L 29/52; H01L 29/60
[52] U.S. Cl. .................... 257/773; 257/737; 257/774; 257/785; 439/91
[58] Field of Search ............ 257/737, 773, 774, 777, 257/778, 780, 781, 785, 781, 785; 439/67, 68, 77, 91

[56] References Cited

U.S. PATENT DOCUMENTS

| | | | |
|---|---|---|---|
| 4,707,657 | 11/1987 | Boegh-Petersen | 439/91 |
| 4,793,814 | 12/1988 | Zifeak et al. | 439/91 |
| 4,932,883 | 6/1990 | Hsia et al. | 439/91 |
| 5,117,069 | 5/1992 | Higgins | 439/66 |
| 5,140,405 | 8/1992 | King et al. | 357/67 |
| 5,147,210 | 9/1992 | Patterson et al. | 439/91 |

FOREIGN PATENT DOCUMENTS 0368262 5/1990 European Pat. Off. .
4363811A 12/1992 Japan .................. H01B 5/16

OTHER PUBLICATIONS

"Area Array Modular I/O Pad to Printed Circuit Board I/O Pad Interconnection Device," IBM Technical Disclosure Bulletin, vol. 27, No. 12, May 1985, pp. 7115–7117.

Primary Examiner—Jerome Jackson
Assistant Examiner—Nathan K. Kelley
Attorney, Agent, or Firm—Minh-Hien N. Clark

[57] ABSTRACT

A compliant integrated circuit (IC) wiring substrate (10) has an insulative carrier film (14) and a plurality of micro-beam conductors (12) in the carrier film. Each of the plurality of micro-beam conductors has a pair of contact bumps (16 and 18) connected to respective posts (22 and 24). A beam element (20) connects the pair of contact bumps and posts at opposing ends and opposing surfaces of the beam element. The plurality of micro-beam conductors extend through the thickness of the carrier film such that the pair of contact bumps protrude from the opposite surfaces of the carrier film. The compliance of the wiring substrate can be varied by varying locations of apertures in the insulative carrier film.

15 Claims, 4 Drawing Sheets

Z-AXIS COMPLIANT MECHANICAL IC WIRING SUBSTRATE AND METHOD FOR MAKING THE SAME

This application is a continuation of prior U.S. application Ser. No. 08/143,775, filed Nov. 1, 1993, now abandoned.

FIELD OF THE INVENTION

The present invention relates to a mechanical integrated circuit (IC) wiring substrate in general, and more specifically to a mechanical IC wiring substrate having z-axis compliant conductors and a method for making the same.

BACKGROUND OF THE INVENTION

The use of very high density, separable, mechanical IC wiring substrates is becoming important as a method of achieving a bumpless interconnect in a semiconductor device and as a method of achieving unpackaged test and burn-in of semiconductor dice or wafers. A conventional method for mounting a semiconductor die on a substrate by means of wireless bonding includes a method in which conductive bumps are formed on an active surface of the semiconductor die, and then the bumps are bonded to bonding pads on the substrate. This method is known as flip-chip bonding and is well known in the art. However, flip-chip bonding has disadvantages in that the bumps on the semiconductor die surface must be formed in advance, and alignment accuracy is critical during the bonding step.

A bumpless wiring substrate having an anisotropic conductive film has been disclosed in the art. The anisotropic conductive film is produced by a method in which conductive particles such as carbon black, graphite, nickel, copper, silver, etc. are dispersed in an insulating resin film. The conductive particles contact each other in the direction normal to the film surface when the film is compressed resulting in z-axis conductivity through the film. These films often require heating to permit thermoset polymer film cure, or softening of a thermoplastic film. A drawback to this type of wiring substrate is that the electrical connection is at least semi-permanent, with subsequent separation requiring a heating and mechanical removal step.

Japanese patent 04-363811A discloses a wiring substrate with conductive bumps on both top and bottom surfaces of the substrate. The substrate is composed of a carrier film which has conductive through-holes. The conductive bumps are formed on top of the through-holes, on both sides of the carrier film. One of the problems with this material is that it requires high pressure contact in order to maintain good electrical connections between a semiconductor die and another substrate.

Another problem with wiring substrates in the prior art is that they are not very reliable for connecting surfaces which are not entirely coplanar. The surface of a semiconductor die, for example, is not always coplanar. Furthermore, on the wafer level, variations in surface flatness across a wafer is probable. The pressure needed to maintain contact across the surface of a semiconductor die or wafer and a substrate will necessarily be high. The contacts do not operate mechanically independent from each other. Therefore, heavy compression at one site due to a higher spot on a substrate induces compression in an adjacent intended contact site, which increases the contact resistance or causes an open circuit.

SUMMARY OF THE INVENTION

The invention provides in one embodiment, a compliant integrated circuit (IC) wiring substrate having an insulative carrier film and a plurality of micro-beam conductors in the carrier film. The carrier film has opposing surfaces and a thickness. Each of the plurality of micro-beam conductors has a pair of contact bumps connected to respective posts. The pair of contact bumps on said posts are connected at opposing ends and opposing surfaces of a beam element. The plurality of conductors extend through the thickness of the carrier film such that the pair of contact bumps protrude from the opposing surfaces of the carrier film.

The invention also provides a method for making a compliant IC wiring substrate. A first insulative layer of carrier film is bonded to a first surface of a conductive layer. A first plurality of through-holes is etched in the first insulative layer. A pattern of beam elements is etched in the conductive layer. A second insulative layer is bonded to a second surface of the conductive layer after the step of etching the pattern of beam elements. A second plurality of through-holes is etched in the second insulative layer. Then the first and second pluralities of through-holes are plated to form respective first and second pluralities of conductive posts and contact bumps. The first pluralities of conductive posts and contact bumps are connected to the second pluralities of conductive posts and contact bumps by the pattern of beam elements in the conductive layer, wherein the first and second pluralities of contact bumps protrude from their respective pluralities of through-holes.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

BRIEF DESCRIPTION OF THE DRAWINGS

Many of the views illustrate the same or similar elements in the different embodiments of the invention. Therefore, the same reference numbers are used to designate elements that are substantially the same or have substantially the same functions in the figures.

DETAILED DESCRIPTION OF A PREFERRED EMBODIMENT

Figure 1:
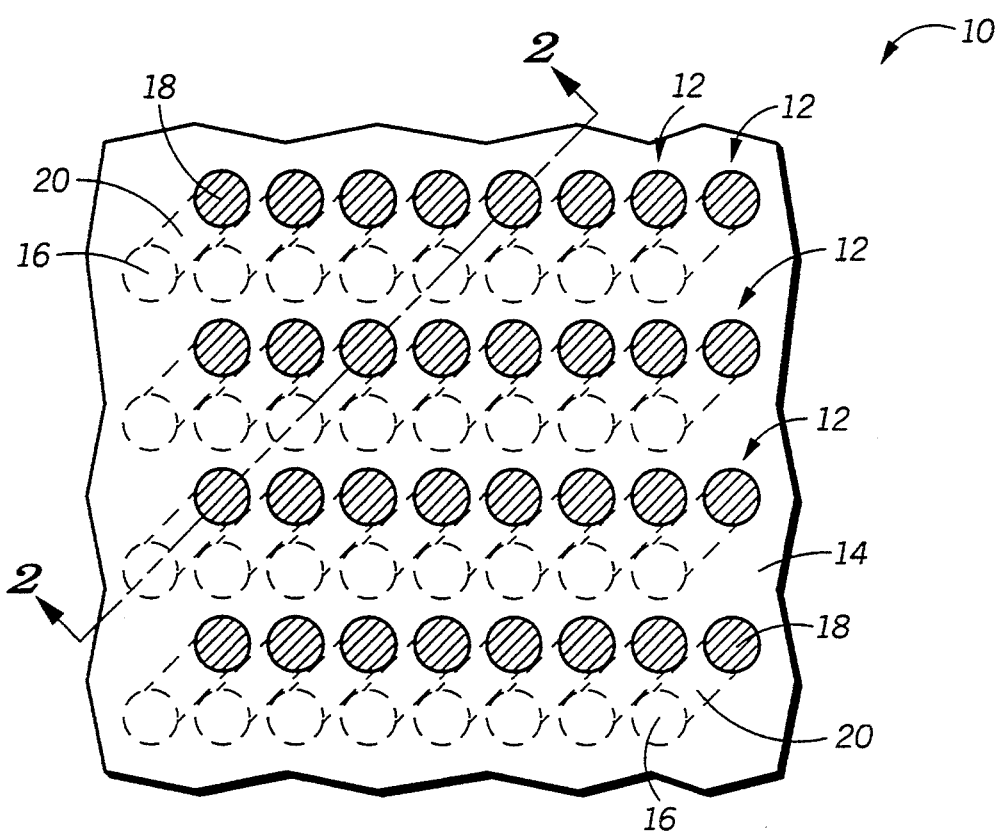
FIG. 1 illustrates, in a top view, a portion of a mechanical IC wiring substrate showing a field of z-axis compliant conductors, in accordance with an embodiment of the present invention.

FIG. 1 illustrates, in a partial top view, a mechanical IC wiring substrate 10 showing a field of z-axis compliant conductors 12 in accordance with an embodiment of the present invention. The compliant mechanical IC wiring substrate is composed of a plurality of micro-beam conductors 12 embedded in, or on, an insulating carrier film 14. The carrier film 14 can be of a variety of nonconductive or insulating materials, such as polyimide, polyester, polystyrene, polyethylene, epoxy resins, urethane, polycarbonate, and silicone. However, the carrier film 14 is in no way limited to the listed materials as other insulating materials may also be suitable for providing the carrier film. The plurality of micro-beam conductors 12 is cantilevered to provide compliance in the z-axis, in contrast to the conductors in the prior art.

As illustrated in FIG. 1, each micro-beam conductor 12 has two contact bumps 16 and 18 which are offset from each other. Each pair of contact bumps is connected by a beam element 20. The dotted lines in FIG. 1 represent hidden lines. The beam elements 20 are embedded in the bulk material of the carrier film 14, and the contact bumps 16 protrude from the bottom surface of the carrier film. The contact bumps 18 protrude from the top surface of the carrier film. This feature is more easily understood in a cross-sectional view along line 2—2 which is illustrated in FIG. 2.

In practicing the invention, each contact bump 16 and 18 would normally be designed to be approximately 10 $\mu$m or greater in diameter. The pitch between two adjacent non-paired contact bumps is approximately 40 $\mu$m or greater. This pitch is dependent on the contact bump diameter. If the contact bump diameter increases, the pitch must also increase based on geometrical considerations. It is envisioned that the beam element will offset the first and second contact bumps by 20 $\mu$m or greater. The longer the beam element, the more compliant the entire micro-beam conductor becomes. Therefore, the length of the beam element should be varied depending on the application of the wiring substrate. When the surfaces of the two substrates to be connected are relatively planar, the beam element can be shorter because less compliance is required in the connecting wiring substrate. However, when variations in surface planarity is expected, the beam elements should be long enough to render the connecting wiring substrate sufficiently compliant to ensure reliable electrical connections. Depending on the application, one might want the smallest contact bumps possible, or larger, coarser size bumps might be suitable.

While all the figures show contact bumps of equal size on both surfaces, this is not necessary. Bump size can vary between surfaces, as long as the beam offset is large enough due to geometric considerations. For connecting substrates (not illustrated) with very fine geometries, the highest density of contact bumps is desirable to ensure good electrical contact between the two substrates. FIG. 1 illustrates 4 rows of conductors, with 4 rows of contact bumps on each surface of the carrier film. The pitch between two rows of contact bumps is approximately 40 $\mu$m or greater. Again, this pitch is dependent on the size of the contact bumps, in addition to the length of the beam elements.

Figure 2:
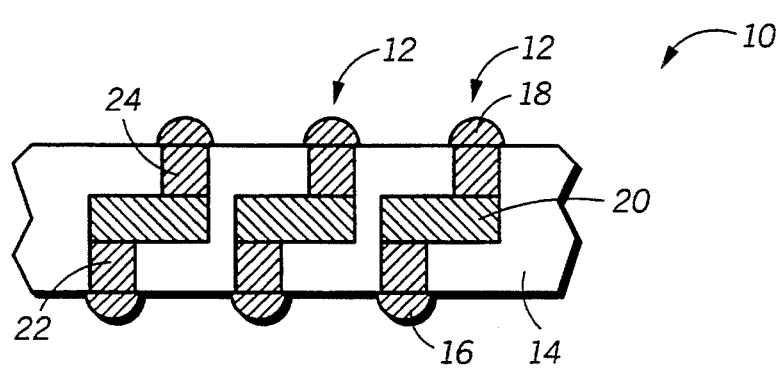
FIG. 2 illustrates, in a cross-sectional view along line 2—2 of FIG. 1, the z-axis compliant conductors.

FIG. 2 illustrates the micro-beam conductors 12 in cross-section. As shown, each micro-beam conductor 12 is composed of the first contact bump 16 which is connected to one end of a first post 22. The other end of the first post 22 is connected to one end the beam element 20, wherein the beam element 20 is substantially perpendicular to the post 22. It is not, a requirement, however, that beam element be perpendicular to the post. Variance from a 90° angle between the two would change the level of compliance of the micro-beam conductor. Also connected to the beam element 20 at the opposing end is a second post 24 which in turn has the second contact bump 18 connected at the end of the post 24. As illustrated in FIG. 2, all the components of the micro-beam conductors 12 are embedded in the carrier film, with only the contact bumps protruding from the top and bottom surfaces of the carrier film. This configuration is more compliant than the material disclosed in JP 04-363811A because of the presence of the beam element 20, which allows the micro-beam conductors to act as cantilevered springs.

As illustrated in FIG. 2, the thickness of the insulating layer can be in a range from 30 $\mu$m to 45 $\mu$m. This thickness is dependent on the total height of the micro-beam conductor 12. The height of the posts 22 and 24 can range from 20 $\mu$m to 30 $\mu$m. Additionally, the thickness of the beam element 20 can range from 10 $\mu$m to 15 $\mu$m. The height of the contact bumps 16 and 18 is typically 10 $\mu$m or greater. It should be noted that although the contact bumps are illustrated with curved surfaces, the top surfaces of these contact bumps can also be flat. One might want flat contact bumps to mate with bumped substrates which typically have rounded bumps formed thereon. These dimensions are not absolute and should be regarded as guidelines of how one might practice the invention.

The metallurgy of the micro-beam conductors 12 may vary in its constituent components to optimize beam stiffness or compliance and contact bump hardness. For example, the beam element 20 and the posts 22 and 24 could be composed of nickel, while the contact bumps are composed of nickel with a gold coating. Alternatively, the beam element could be composed of copper, while the posts and contact bumps are composed of nickel with a gold plate covering the contact bumps. Additionally, the entire micro-beam conductor could be composed of copper. Thus, it should be apparent that the metallurgy of the micro-beam conductor is not limited to any particular metal but can be composed of a variety of conductive metals, such as nickel, gold, copper, aluminum, tungsten, and alloys thereof.

Figure 3:
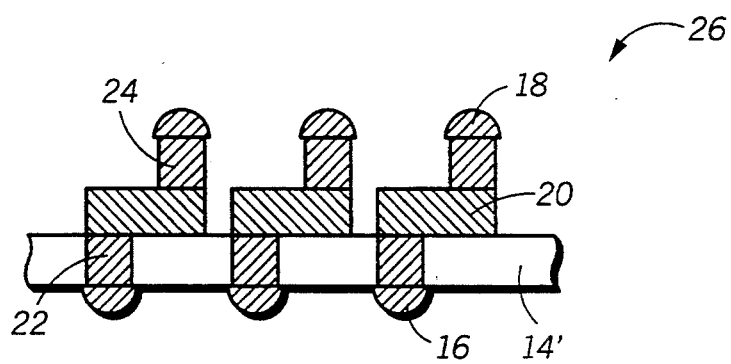
FIGS. 3–5 illustrate, in cross-section, alternative embodiments of z-axis compliant conductors having different cantilever spring stiffnesses, in accordance with the invention.

FIG. 3 illustrates, in cross section, an alternative embodiment of a z-axis compliant wiring substrate in accordance with the invention. In this embodiment, the micro-beam conductors 12 are not entirely embedded within the thickness of the carrier film 14'. The carrier film 14' has a plurality of holes through which the posts 22 fit so that the contact bumps 16 protrude from the bottom surface of the carrier film. The beam element 20 overlies the substantially planar surface of the carrier film. In this configuration, only one of the posts 22 is embedded within the bulk material of the carrier film. The thickness of the carrier film 14' can be as low as 10 $\mu$m in this embodiment. The configuration in FIG. 3 is more compliant (or less stiff) than the configuration illustrated in FIG. 2. In FIG. 2, the bulk material of the carrier film is intimate contact with all components of the micro-beam conductors thus restricting the movement of the beam conductors so that they are effectively stiffer than similar beam elements that are freely cantilevered.

Figure 4:
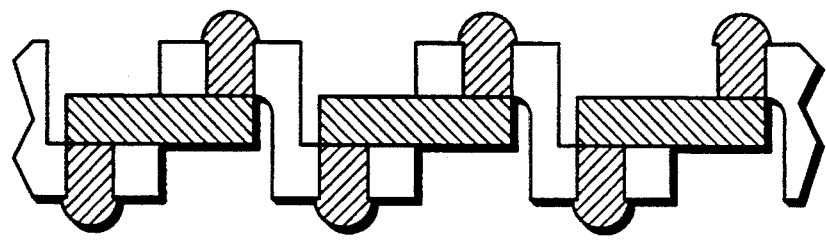
Figure 5:
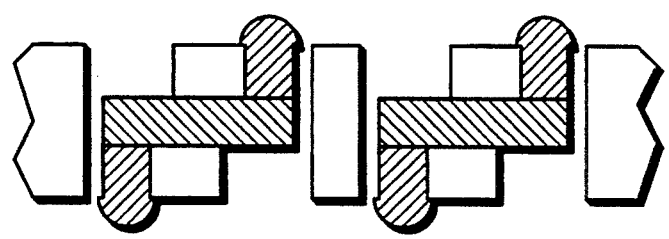

FIGS. 4 and 5 illustrate, in cross-section, yet other alternative embodiments of a z-axis compliant wiring substrate in accordance with the invention. In these embodiments, the carrier film 14" has different size apertures in the carrier film in addition to the through-holes for containing the posts. By reducing the amount of material in intimate contact with the posts and beam element, the conductor becomes more compliant or less stiff because there is less restriction in the movement of the conductors. The configuration in FIG. 4 is stiffer than the configuration in FIG. 5 because FIG. 5 illustrates a practically freely cantilevered conductor. The polymer carrier film in FIG. 4 completely encircles the posts, while the beam end which supports the post, has no insulative material opposing and supporting it. It should be noted that the configurations illustrated in FIGS. 4 and 5 may require longer beam elements than the configurations in FIGS. 2 and 3. The beam element 20' should be approximately 4 times the diameter of the posts 22 and 24. The beam element could also be longer depending on the application and desired density of conductors in the wiring substrate.

Figure 6:
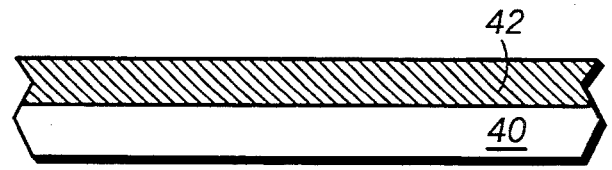
FIGS. 6–11 illustrate, in cross-section, process steps for making a compliant IC wiring substrate in accordance with the invention.

Also in accordance with the invention is a method for making the mechanical connector interface having compliant micro-beam conductors. FIGS. 6–11 illustrate, in cross-section, process steps for making a compliant mechanical connector. As depicted in FIG. 6, an insulating layer 40 is coupled to a conductive layer 42. Insulating layer 40 can be a polyimide resin cast from liquid state onto a conductive layer 42 of copper foil. Alternatively, copper could be plated onto a preformed polyimide layer. The thickness of the conductive layer 42 can be substantially in a range of 0.5 to 0.75 mils (0.013 to 0.019 millimeter), but thicker and thinner layers are possible. The thickness of the insulating layer 40 can be in a range of 0.75 to 1 mil (0.019 to 0.025 millimeter), but thicker and thinner layers are possible.

Figure 7:
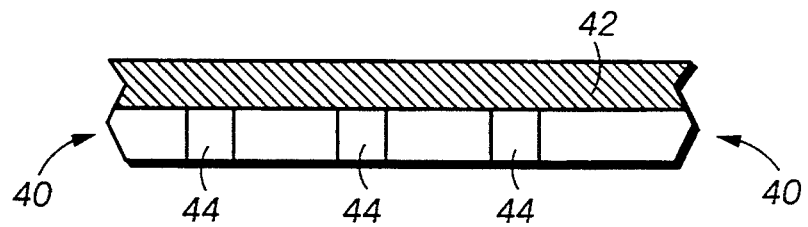
Figure 8:
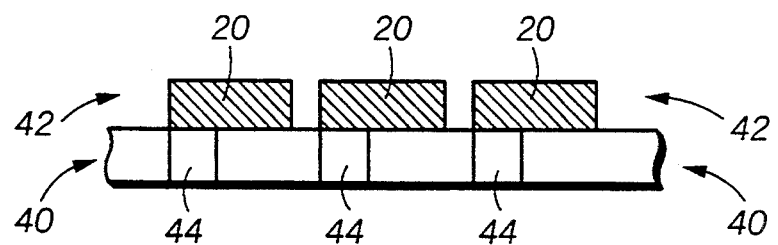
Figure 9:
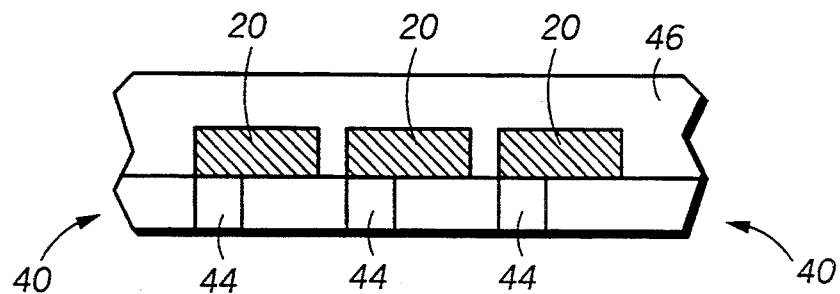
Figure 10:
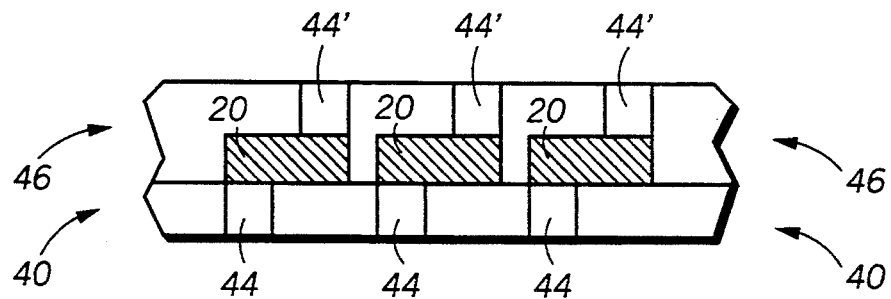
Figure 11:
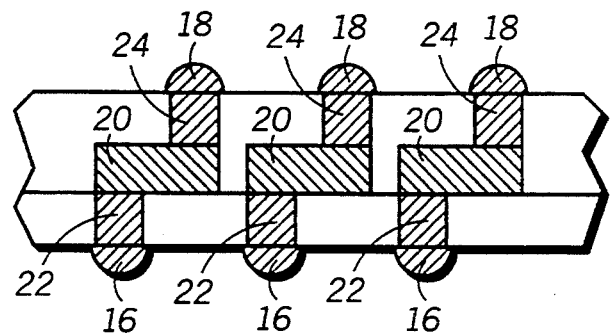

FIG. 7 illustrates the next step in the method of making the mechanical connector interface. A pattern of through-holes 44 are etched into the insulating layer 40. Methods of etching polyimide are well known in the art, and may involve chemical, mechanical, or non-contact means incorporating plasmas or other types of energetic ion processing, such as reactive ion etching, and ion milling. The size of the through-holes 44 can be approximately 0.5 mil (0.013 millimeter). After the step of etching the through-holes in the insulating layer 40, the conductive layer 42 is etched to form the beam elements 20, as illustrated in FIG. 8. The next step in the process is shown in FIG. 9. A second layer of insulating resin 46 is cast on top of the beam elements 20. The chemistry of the second insulating layer 46 can be exactly the same as that of the first insulating layer 40. However, dissimilar materials may also be used to vary the stiffness of the wiring substrate by imposing different constraints on the opposing posts and bumps. This second insulating layer 46 is then etched to form the second set of through holes 44', as illustrated in FIG. 10. A layer of photoresist can then applied to both the top and bottom surfaces of the carrier film. Alternatively, the layer of photoresist can be substituted for the second layer of insulating resin 46. If the photoresist were used for the second insulating layer, the cost of manufacturing the wiring substrate is reduced in addition to making the wiring substrate more compliant than using, for example polyimide.

After the photoresist is developed, the through-holes can then be plated to form the posts 22 and 24 and the contact bumps 16 and 18. A top coating of gold may be applied to the outer surfaces of the contact bumps 16 and 18 to provide a non-oxidizing, low contact resistance surface. If greater compliance is desired in the mechanical wiring substrate, then another layer of photoresist can be applied and developed on the surfaces of the either the first and/or second insulating layers. The carrier film can be further etched to remove more of the insulating layers surrounding the beam elements 20, to achieve the configurations illustrated in FIGS. 4 and 5. In this manner, the micro-beam conductor 12 has greater freedom to flex in order to compensate for non-coplanar surfaces.

Figure 12:
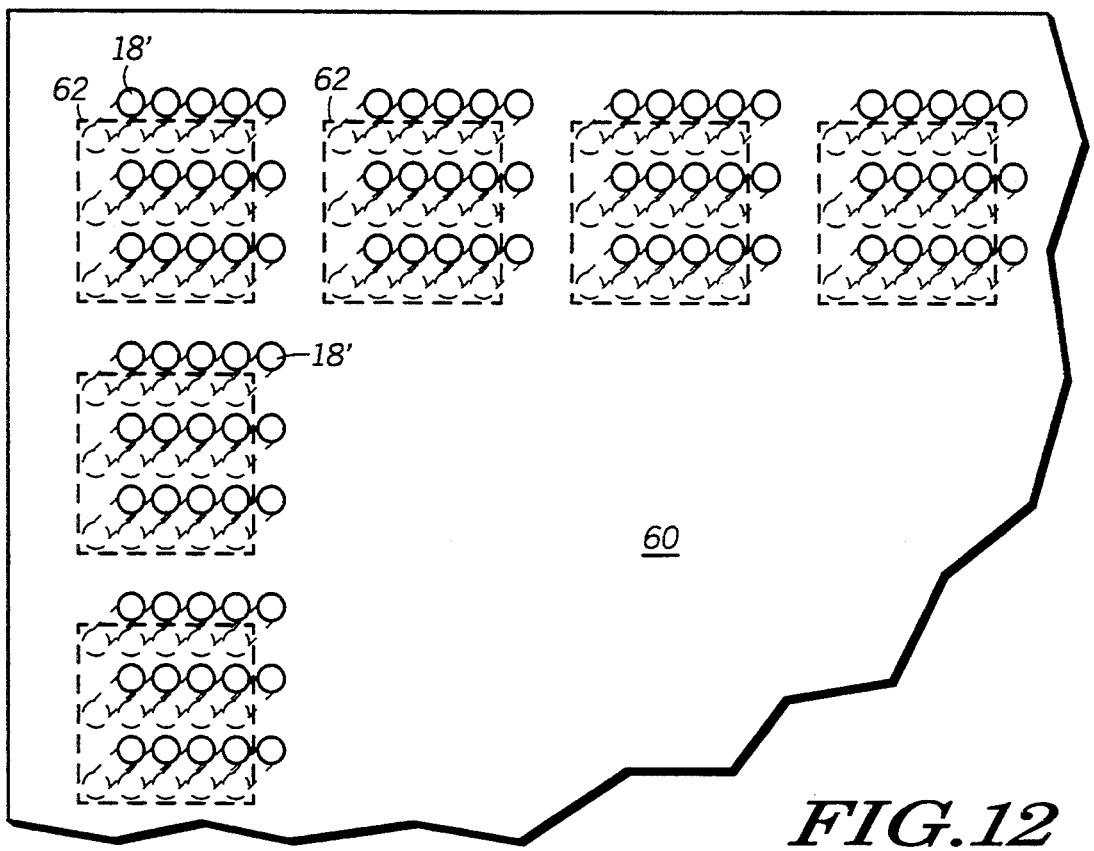
FIGS. 12–13 illustrate, in top views, alternative configurations of the compliant IC wiring substrate for use with a semiconductor die having bonding pads.
Figure 13:
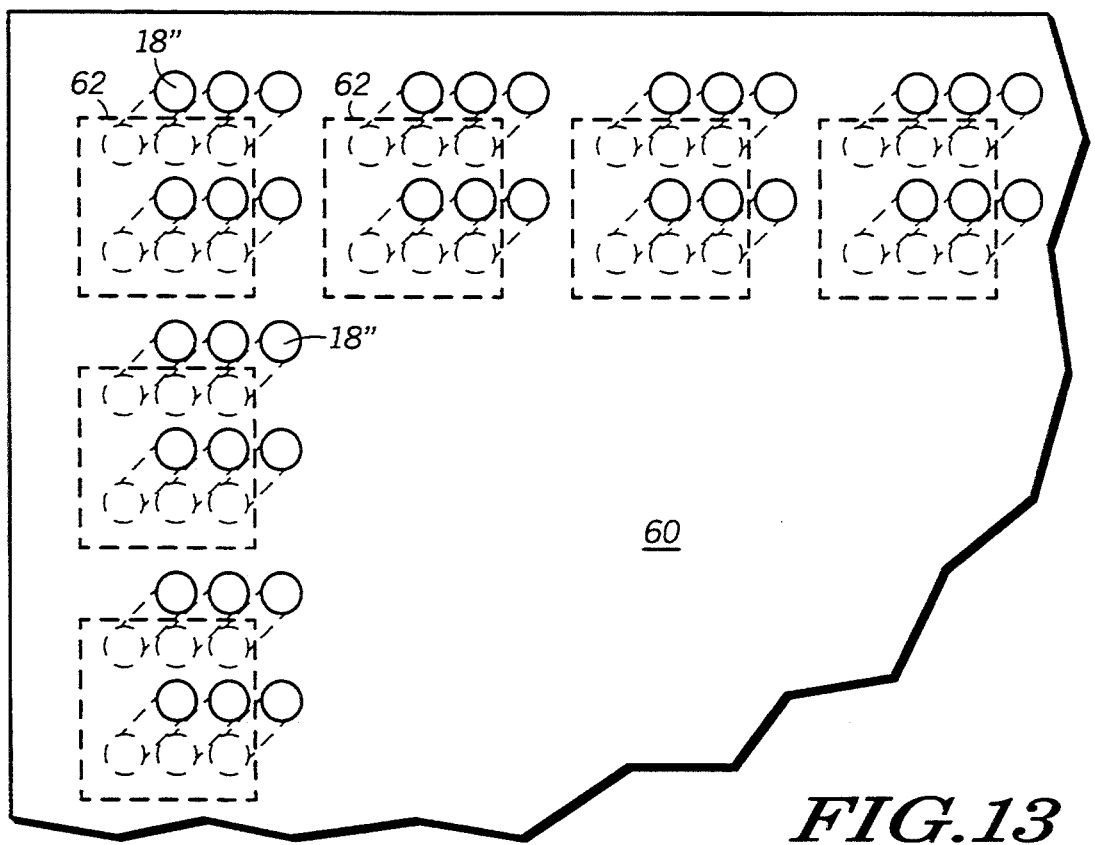

The foregoing description has described a wiring substrate with a continuous field of micro-beam conductors with offset contact bumps to be used for connecting two different substrates, such as a semiconductor die to a test substrate or a semiconductor die to a multichip module substrate. However, it is also possible to tailor the locations of the micro-beam conductors to coincide with specific locations of bonding pads on a semiconductor die. For example, FIG. 12 illustrates, in a top view, a portion of wiring substrate overlying a semiconductor die 60 having bonding pads 62, measuring 100 $\mu$m on a side, with 150 $\mu$m pitch between the bonding pads. The wiring substrate could be designed such that the micro-beam conductors align with the bonding pad locations with 15 small contact bumps 18' per bonding pad 62. Alternatively, the wiring substrate could have 6 large contact bumps 18" per bonding pad 62 as illustrated in FIG. 13. Depending upon the geometries of the beam connecting the contact bumps, the relative compliance of the contacts shown in FIG. 12 and 13 could be quite different, allowing the user to tailor the connector for specific applications. If contact resistance is a critical concern, up to a point, it may be desirable to have a larger number of small bumps contacting the surfaces. If the surfaces being contacted by the contact bumps is very hard, the actual contact surface area will not be proportional to the contact bump diameter, and it may be desirable to have more contact points.

The foregoing description and illustrations contained herein demonstrate many of the advantages associated with the present invention. In particular, it has been revealed that a separable compliant connector film or wiring substrate may be used to temporarily or permanently connect two electrical circuit elements, each of which may possess a field of non-planar contact pads. Moreover, this continuous field of connector elements on the wiring substrate allows a degree of misalignment of two circuit elements to be interconnected due to the compliance offered by each of the electrically isolated micro-beam conductor elements. Yet another advantage is that the present invention can be tailored to provide connector elements or contact bumps in precise locations.

Thus it is apparent that there has been provided, in accordance with the invention, a high density, z-axis compliant mechanical IC wiring substrate and a method for making the same that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, chemistry and dimensions of connector circuit elements can be varied substantially while preserving the intent of the present invention. In addition, the invention is not limited to use in the examples provided, such as testing an integrated circuit or semiconductor die, and permanently connecting an integrated circuit or semiconductor die to a multichip module substrate. It is also important to note that the present invention is not limited in any way to connections between ICs and other types of substrates. Furthermore, it is intended that the present invention can be used to test interconnected substrates populated with electronic components, and to temporarily or permanently provide electrical interconnections between such interconnected substrates. Therefore, it is intended that this invention encompass all such variations and modifications falling within the scope of the appended claims.

I claim:

1. A compliant integrated circuit (IC) wiring substrate comprising:
   a polymer carrier film having opposing surfaces and a thickness; and
   a plurality of micro-beam conductors having a size on a micron level in the carrier film, each conductor having:
      a cross beam element having a thickness substantially in a range of 10 to 15 microns embedded within the thickness of the carrier film, wherein the cross beam element has an orientation substantially parallel to the opposing surfaces of the carrier film;
      a first post having a height substantially in a range of 20 to 30 microns connected on a first end of the cross beam element on a first surface of the cross beam element;
      a second post intimately connected to a second opposing end of the cross beam element on a second opposing surface of the cross beam element; and
      first and second contact bumps connected to respective first and second posts and protruding from the opposing surfaces of the carrier film wherein the first and second contact bumps are of approximately a same width as their connected first and second posts.

2. The wiring substrate according to claim 1, wherein the carrier film is made of polyimide, and wherein the thickness of the carrier film is substantially in a range of 25 to 50 microns.

3. The wiring substrate according to claim 1, wherein the plurality of micro-beam conductors is arranged in a pattern corresponding to a plurality of bonding pads disposed on a semiconductor die such that more than one of each first contact bump contacts a same bonding pad.

4. The wiring substrate according to claim 1, wherein the cross beam element comprises a metal selected from a group consisting of nickel and copper; and wherein the first and second posts and the first and second contact bumps comprise a metal selected from a group consisting of nickel, copper, and gold.

5. A compliant integrated circuit (IC) wiring substrate comprising:
   a polymer carrier film having substantially planar first and second surfaces;
   a plurality of through-holes in the carrier film; and
   a plurality of micro-beam conductors having a size on a micron level in the carrier film, each conductor having:
      a first contact bump on one end of the conductor, the first contact bump protruding from the first surface of the carrier film;
      a first post connected to the first contact bump, the first post filling one of the plurality of through-holes;
      a cross beam element having a thickness substantially in a range of 10 to 15 microns connected at one end to the first post, the cross beam element overlying the substantially planar second surface of the carrier film;
      a second post connected to an opposing end of the beam element, wherein the second post extends away from the second surface of the carrier film and wherein the second post is free to flex; and
      a second contact bump at an end of the second post, wherein the second contact bump has approximately a same width as the cross beam element.

6. The wiring substrate according to claim 5, wherein the carrier film is composed of a material selected from a group consisting of: polyester, polystyrene, polyethylene, epoxy resin, urethane, polycarbonate, silicone, and polyimide.

7. The wiring substrate according to claim 5, wherein the plurality of micro-beam conductors is arranged in a pattern corresponding to a plurality of bonding pads disposed on a semiconductor die such that more than one of each first contact bump contacts a same bonding pad.

8. The wiring substrate according to claim 5, wherein the cross beam element comprises a metal selected from a group consisting of nickel and copper; and wherein the first and second posts and the first and second contact bumps comprise a metal selected from a group consisting of nickel, copper, and gold.

9. The wiring substrate according to claim 5, further comprising:
   a second polymer carrier film, having a different chemistry than the first polymer carrier film, overlying the second surface of the first carrier film, wherein the second carrier film masks the cross beam element and the second post of each of the plurality of micro-beam conductors such that only each second contact bump of the plurality of micro-beam conductors protrudes from a top surface of the second carrier film.

10. A compliant integrated circuit (IC) wiring substrate comprising:
    a polymer carrier film having a thickness and opposing surfaces;
    first and second plurality of apertures on the opposing surfaces of the carrier film; and
    a plurality of micro-beam conductors having a size on a micron level in the carrier film, each conductor having:
       a cross beam element having a thickness substantially in a range of 10 to 15 microns embedded within the thickness of the carrier film, wherein the cross beam element has an orientation substantially parallel to the opposing surfaces of the carrier film;
       a first post connected on a first end of the cross beam element on a first surface of the cross beam element;

a second post connected on a second opposing end of the cross beam element on a second opposing surface of the cross beam element, wherein the first and second posts have a height substantially in a range of 20 to 30 microns; and first and second contact bumps connected to respective first and second posts and protruding from the opposing surfaces of the carrier film, wherein the first and second plurality of apertures expose a portion of the first and second surfaces of the cross beam element, wherein the exposed portion of the first surface is at an opposing end of the cross beam element from the exposed portion of the second surface.

11. The wiring substrate according to claim 10, wherein the carrier film is composed of a material selected from a group consisting of: polyester, polystyrene, polyethylene, epoxy resin, urethane, polycarbonate, silicone, and polyimide.

12. The wiring substrate according to claim 10, wherein the cross beam element comprises a metal selected from a group consisting of nickel and copper; and wherein the first and second posts and the first and second contact bumps comprise a metal selected from a group consisting of nickel, copper, and gold.

13. The wiring substrate according to claim 10, wherein the plurality of micro-beam conductors is arranged in a pattern corresponding to a plurality of bonding pads disposed on a semiconductor die such that more than one of each first contact bump contacts a same bonding pad.

14. The wiring substrate according to claim 10, wherein the first and second plurality of apertures further expose a vertical portion of the first and second posts.

15. The wiring substrate according to claim 10, wherein the first post has a diameter, and the cross beam element has a length approximately equal to four times said diameter.

* * * * *